(12) United States Patent
Huang et al.

(10) Patent No.: US 6,437,447 B1
(45) Date of Patent: Aug. 20, 2002

(54) DUAL-SIDED CHIP PACKAGE WITHOUT A DIE PAD

(75) Inventors: Chien-Ping Huang, Hsinchu; Chin-Yuan Hung, Fengyuan; Chang-Fu Chen, Taichung; Jenn-Shyh Yu, Fengyuan; Jui-Hsiang Hung, Changhua, all of (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/697,296

(22) Filed: Oct. 27, 2000

(30) Foreign Application Priority Data

Sep. 6, 2000 (TW) ........................................ 89118278 A

(51) Int. Cl.$^7$ .............................................. H01L 23/48

(52) U.S. Cl. ........................ 257/777; 257/676; 257/695; 257/691; 257/666; 257/784

(58) Field of Search ................................. 257/676, 723, 257/690, 693, 691, 666, 777, 695, 784

(56) References Cited

U.S. PATENT DOCUMENTS

| | | | | |
|---|---|---|---|---|
| 5,701,031 A | * | 12/1997 | Oguchi et al. | 257/686 |
| 5,793,108 A | * | 8/1998 | Nakanishi | 257/723 |
| 6,077,724 A | * | 6/2000 | Chen | 438/107 |
| 6,087,722 A | * | 7/2000 | Lee et al. | 257/723 |
| 6,175,149 B1 | * | 1/2001 | Akram | 257/676 |

* cited by examiner

Primary Examiner—David L. Talbott
Assistant Examiner—Luan Thai
(74) Attorney, Agent, or Firm—Rabin & Berdo, P.C.

(57) ABSTRACT

In a dual-sided chip package without a die pad according to the invention, a first die can be fixed directly on the lead fingers of a leadframe, a support bar, or bus bars, while a second die is attached to the first die. Without a die pad, the distance between the surfaces of the dies and the plastic surface of the package therefore gets longer. Thus, the invention enables a large decrease in the probability of generating voids in the plastic and there is no need to grind the dies. Besides, it improves the vibration and floating characteristics of the dies in the manufacturing process and thus prevents the exposure of the bonding wires and the shelling off or breaking of the dies. The invention can raise the yield of chip packages.

12 Claims, 4 Drawing Sheets

US 6,437,447 B1

DUAL-SIDED CHIP PACKAGE WITHOUT A DIE PAD

BACKGROUND OF THE INVENTION

This application incorporates by reference Taiwanese application Serial No. 89118278, Filed Sep. 6th, 2000.

1. Field of the Invention

A invention relates in general to a dual-sided chip package, and more particularly to a dual-sided chip package without a die pad.

2. Description of the Related Art

A leadframe is commonly used for providing a die pad capable of mounting dies in the packaging process of an Integrated Circuit (IC) die. The leadframe includes a set of lead fingers for providing the electrical connection between the IC die and external circuitry. A method for constructing a dual-sided chip package is disclosed in U.S. Pat. No. 5,527,740.

Referring to FIG. 1, a cross sectional view of the traditional dual-sided chip package is shown. In the chip package 100, the dies 102 and 104 are respectively mounted on the die pad 109 by using the adhesives 106 and 108. The bonding wires 110 and 112 couple the die 102 with the inner lead fingers 114 and 116 while the bonding wires 118 and 120 couple the die 104 with the inner lead fingers 114 and 116. The inside of plastic mold 122 includes the die pad 109, the dies 102 and 104, the bonding wires 110,112, 118 and 120, and the inner lead fingers 114 and 116.

While applying the traditional dual-sided chip package to the Thin Small Outline Package (TSOP), however, the flow of plastic between the surface 124 and the die surface 126 during plastic injection molding is slowed due to the short distance L between the surface 124 and the die surface 126. This might cause a backflow effect and generate voids.

The dies 102 and 104 have to be ground to 6 mil (=0.15 mm) conventionally. However, it might raise the manufacture cost to grind the dies 102 and 104. Besides, it is hard to handle the ground dies and the defect rate gets higher.

In addition, the Coefficient of Thermal Expansion (CTE) of the dies 102 and 104 and the die pad 109 are different. In FIG. 1, since the dies 102 and 104 are respectively mounted on the die pad 109 by using the adhesives 106 and 108, the variation of the temperature caused in the packaging process generates thermal stress due to the different speed of thermal expansion or shrinkage. The dies 102 and 104 may shell off or break as a result of the thermal stress effect. The thinner the dies 102 and 104, the more serious the shelling and breaking.

Furthermore, the die pad 109 of the traditional dual-sided chip package is supported by two or four support bars in the packaging process. Therefore, the different flows of plastic in the up, down, right and left directions might cause vibration and floating of the die pad 109 and the dies 102 and 104 during the plastic injection molding and then the bonding wire 110, 112, 118 and 120 might be exposed outside. Thus, special control is needed for preventing the exposure of the bonding wire and high deficiency.

SUMMARY OF THE INVENTION

It is therefore an object of the invention to provide a dual-sided chip package without a die pad. Without using the die pad, the distance between the die surface and the plastic surface gets longer. Thus, it enables a large decrease in the probability of generating voids with no need to grind the dies according to this invention. Besides, it improves the vibration and floating of the die pad in the manufacturing process and thus prevents the exposure of the bonding wire and the shelling off or breaking of the dies.

The invention achieves the above-identified objects by providing a dual-sided chip package without a die pad including a leadframe, first die, first bonding wire, second bonding wire, second die, third bonding wire, fourth bonding wire and plastic mold. The leadframe includes a first inner lead finger and a second inner lead finger. The first side of the first die is attached to the first inner lead finger and the second inner lead finger. The first bonding wire and a second bonding wire couple the first die with the first inner lead finger and the second inner lead finger respectively. Besides, the second die attached to the first side of the first die, wherein the second die is disposed between the first inner lead finger and the second inner lead finger. The third bonding wire and the fourth bonding wire couple the second die with the first inner lead finger and the second inner lead finger. The inside of the package includes the first die, second die, first bonding wire, second bonding wire, third bonding wire, fourth bonding wire, first inner lead finger, and second inner lead finger.

The invention achieves the above-identified objects by providing another dual-sided chip package without a die pad including a leadframe, first die, first bonding wire, second bonding wire, second die, third bonding wire, fourth bonding wire and plastic mold. The leadframe includes a first support bar, a second support bar, a first inner lead finger and a second inner lead finger. The first support bar and the second support bar are disposed between the first inner lead finger and the second inner lead finger. The first side of the first die is attached to the first support bar and the second support bar and the first die is disposed between the first inner lead finger and the second inner lead finger. The first bonding wire and a second bonding wire couple the first die with the first inner lead finger and the second inner lead finger respectively. Besides, the second die attached to the first side of the first die, wherein the second die is disposed between the first support bar and the second support bar. The third bonding wire and the fourth bonding wire couple the second die with the first inner lead finger and the second inner lead finger. The inside of plastic mold includes the first die, second die, first bonding wire, second bonding wire, third bonding wire, fourth bonding wire, first support bar, second support bar, first inner lead finger, and second inner lead finger.

The invention achieves the above-identified objects by providing the other dual-sided chip package without a die pad including a leadframe, first die, first bonding wire, second bonding wire, second die, third bonding wire, fourth bonding wire and plastic mold. The leadframe includes a first bus bar, a second bus bar, a first inner lead finger and a second inner lead finger. The first bus bar and the second bus bar are disposed between the first inner lead finger and the second inner lead finger. The first side of the first die is attached to the first bus bar and the second bus bar and the first die is disposed between the first inner lead finger and the second inner lead finger. The first bonding wire and a second bonding wire couple the first die with the first inner lead finger and the second inner lead finger respectively. Besides, the second die attached to the first side of the first die, wherein the second die is disposed between the first bus bar and the second bus bar. The third bonding wire and the fourth bonding wire couple the second die with the first inner lead finger and the second inner lead finger. The inside of plastic mold includes the first die, second die, first bonding wire, second bonding wire, third bonding wire, fourth bonding wire, first bus bar, second bus bar, first inner lead finger, and second inner lead finger.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

The dual-sided chip package without a die pad according to the invention can fixed to a first die directly on the lead fingers of a leadframe, a support bar, or bus bars, while a second die is attached to the first die. Without using a die pad, the distance between the die surface and the plastic surface of the package therefore gets longer. While applying the traditional dual-sided chip package to the Thin Small Outline Package (TSOP), it can raise the yield of the chip packages with no need to grind. The preferred embodiments of the invention are as follows:

Embodiment 1

Figure 2:
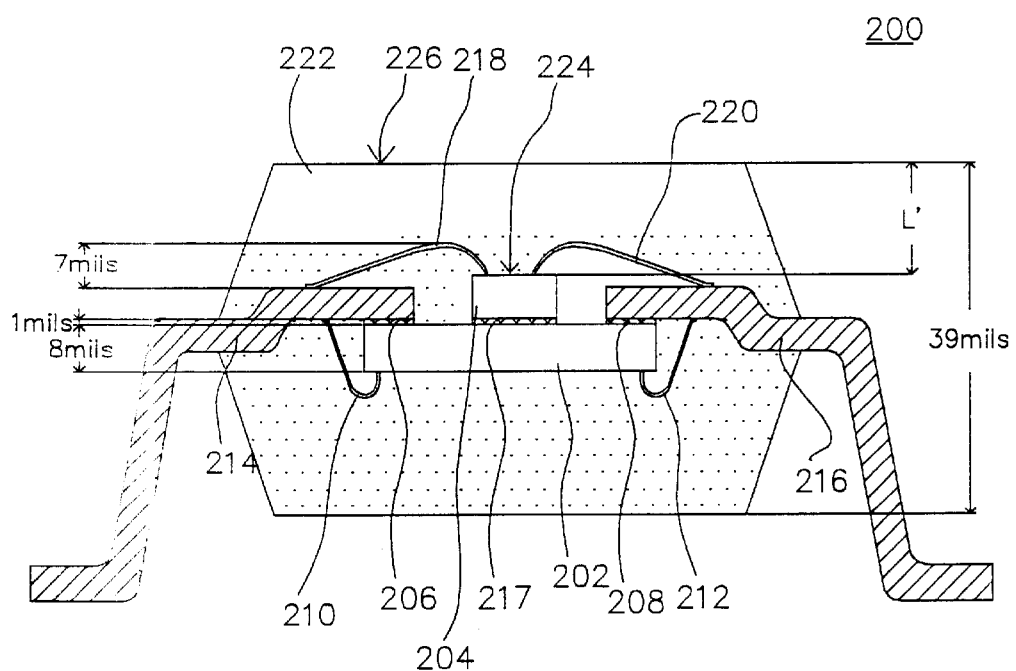
FIG. 2 shows a cross sectional view of a dual-sided chip package without a die pad according to the first preferred embodiment of the invention.

Referring to FIG. 2, a cross sectional view of a dual-sided chip package without a die pad according to the first preferred embodiment of the invention is shown. It shows the two dies are back-to-back in disposition. In the chip package 200, the die 202 is attached to the inner lead fingers 214 and 216 by using the adhesives 206 and 208. The bonding wires 210 and 212 couple the die 202 with the inner lead fingers 214 and 216. The die 204 is attached to the die 202 by using the adhesives 217 so that the back of the die 202 connects to the back of the die 204. The bonding wires 218 and 220 couple the die 204 with the inner lead fingers 214 and 216. The inside of a molded plastic body, or plastic mold 222, includes the dies 202 and 204, the bonding wires 210, 212, 218 and 220, and the inner lead fingers 214 and 216.

The manufacturing method of the dual-sided chip package without a die pad according to the invention is as follows: the die 202 is first attached to the inner lead fingers 214 and 216 by using the adhesives 206 and 208 and then wire bonded to the inner lead fingers 214 and 216. The die 204 is attached to the back of die 202 by using the adhesives 217 and then wire bonded to the inner lead fingers 214 and 216. The dies 202 and 204 are finally encapsulated to form the chip package 200, wherein the adhesive is made of nonconductive plastics, a resin or the polyimide tape.

According to the invention, there is no need to use a die pad and grind the dies to increase the distance L' between the die surface 224 and the plastic surface 226, and this enables a large decrease in the probability of generating voids during the process of plastic injection molding. The tolerance capability of the wire loop raises as the distance L' between the die surface 224 and the plastic surface 226 increases. Therefore, it prevents the exposure of the bonding wire without the special control of the wire loop. Besides, the die 202 is directly attached to the inner lead fingers 214 and 216 and thus the vibration and floating of the dies 202 and 204 do not occur in the process of plastic injection molding. Combined with the above mentioned advantages, the dual-sided chip package without a die pad according to the invention can raise the yield of chip packages.

Figure 1:
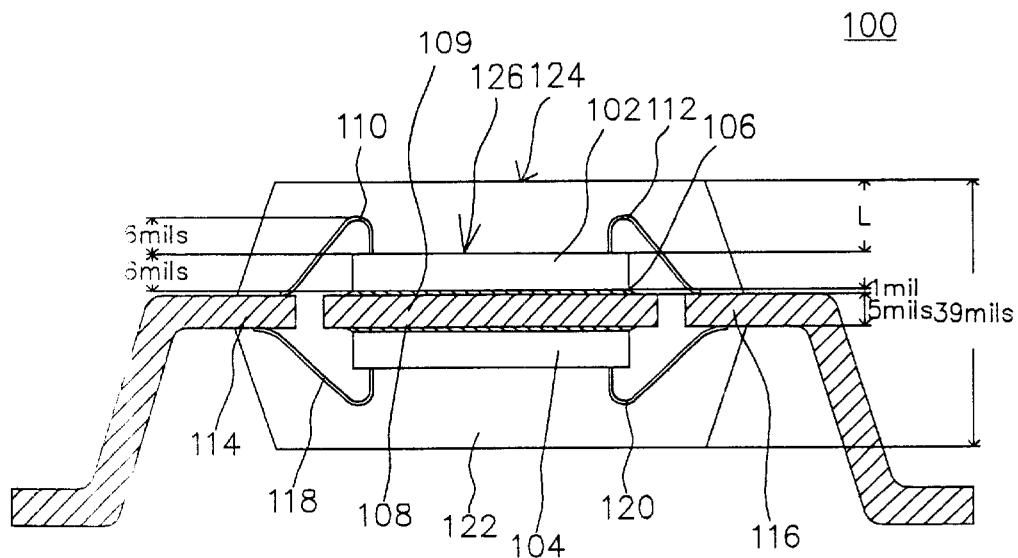
FIG. 1 shows a cross sectional view of the traditional dual-sided chip package.

Taking the Thin Small Outline Package (TSOP) as an example, the thickness of the chip package is around 39 mils. With the traditional dual-sided chip package as shown in FIG. 1, the dies 102 and 104 have to be ground down to approximately 6 mils in order to increase the distance between the die surface 126 and the plastic surface 124. And the thickness of the die pad is 5 mils, the thicknesses of the adhesives 106 and 108 are 1 mils, and the distance between the summit of the bonding wire 110 and the die surface 126 is 6 mils. Therefore, the distance between the die surface 126 and the plastic surface 124 is 10 mils. However, as shown in FIG. 2, for the dual-sided chip package without a die pad according to the invention, the dies 202 and 204 can be 8 mils in thickness without being ground. Meanwhile, the distance L' between the dies surface 224 and the plastic surface 226 is (39−8−8−1)/2=11 mils and the distance between the summit of the bonding wire 218 and the die surface 224 can be up to 7 mils. Thorny problems like the breakage of the die 202 on the die 204 decrease since it is unnecessary to grind the dies 202 and 204. Beside, the longer distance L' between the die surface 224 and the plastic surface 226 enables a large decrease in the probability of generating voids and exposing the wind bonds.

On the other hand, the dies 202 and 204 are joined together only by using the adhesive 217. Since the CTE of the dies 202 and 204 are equal, the speeds of thermal expansion or shrinkage of them are the same. The dual-sided chip package according to the invention can be influenced less than the former one by thermal stress. It can efficiently solve the prior art problem of the thermal stress caused by the different CTE of the die pad 109 and the dies 102 and 104. In other words, the dies 202 and 204 do not shell off or break as a result of thermal stress generated by a variation of the temperature.

In the process of plastic injection molding, the flow of plastic cannot influence the die 202 and cause vibration or floating thereof since the die 202 is steadily attached to the inner lead fingers 214 and 206. The yield of chip packages increases due to less exposure of the bonding wires.

Embodiment 2

Figure 3A:
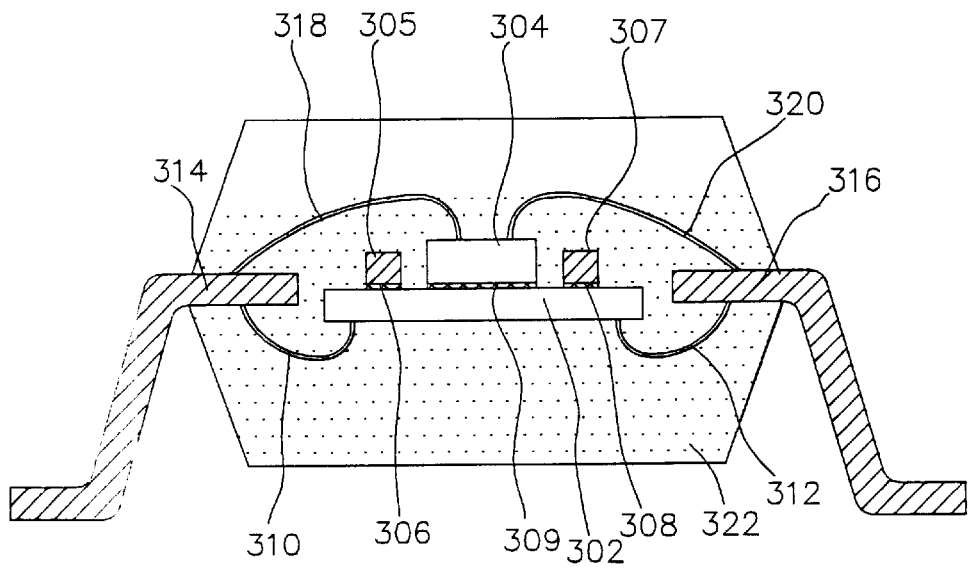
FIGS. 3A~3B show a cross sectional view and an upper view of a dual-sided chip package without a die pad by using a support bar according to the second preferred embodiment of the invention.
Figure 3B:
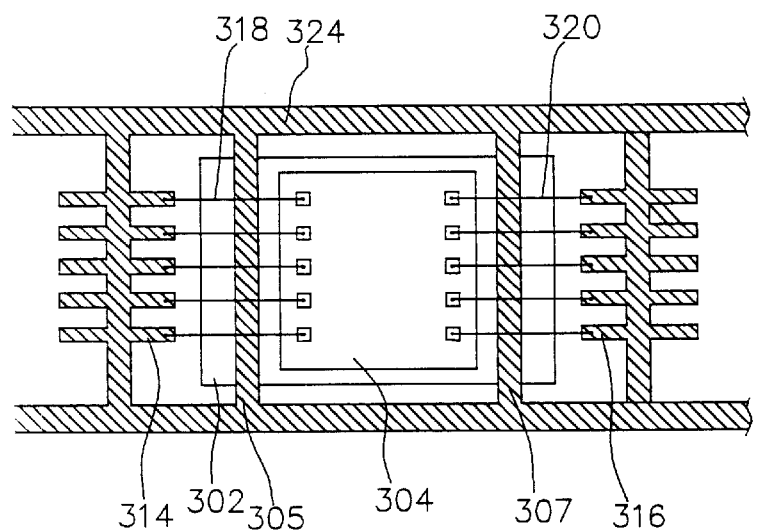

Referring to FIGS. 3A~3B, a cross sectional view and an upper view of a dual-sided chip package which lacks a die pad and which uses a support bar arrangement according to the second preferred embodiment of the invention are shown. The two dies are in back-to-back disposition. Within the spirit disclosed in the first example according to the invention, one of the dies can be either attached to the inner lead fingers directly or fixed on a support bar of the leadframe. As shown in FIGS. 3A–3B, the die 302 is attached to the support bars 305 and 307 by using the adhesive 306 and 308 respectively. The bonding wires 310 and 312 couple the die 302 and the inner lead fingers 314 and 316. The die 304 is attached to the back of the die 302 by using the adhesive 309 so that the back of the die 302 connects to the back of the die 304. The bonding wires 318 and 320 couple the die 304 and the inner lead fingers 314 and 316. The inside of molded plastic body or plastic mold 322 includes the dies 302 and 304, the bonding wires 310, 312, 318 and 320, the support bar 305 and 307, and the inner lead fingers 314 and 316. The support bars 305 and 307 for supporting the dies 302 and 304 are rectangular and connected with the leadframe 324.

Figure 4:
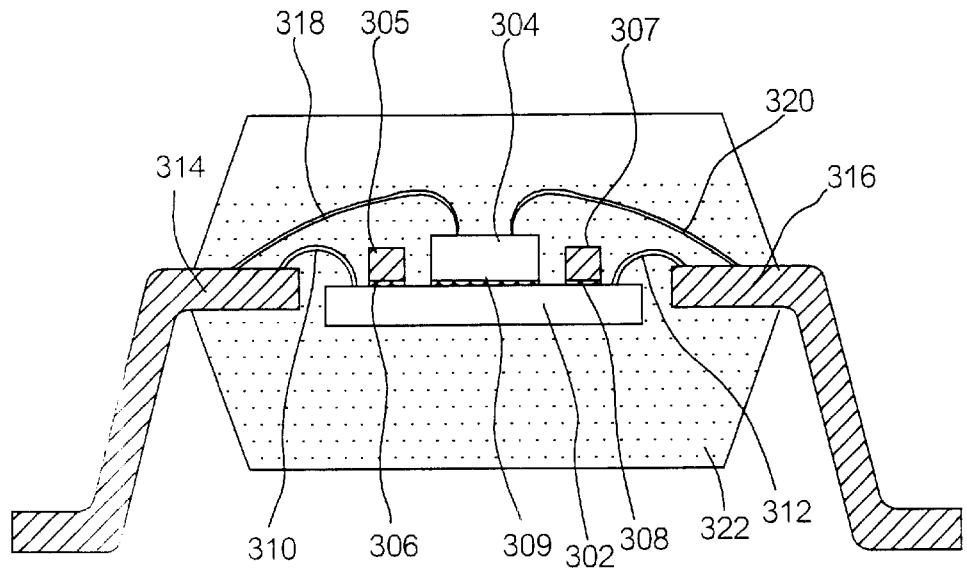
FIG. 4 shows a cross sectional view of another dual-sided chip package without a die pad corresponding to FIGS. 3A~3B.

Moreover, within the spirit according to the invention disclosed in FIGS. 3A–3B, the TV/Co dies 304 and 306 can be either in back-to-back disposition or in front-to-back disposition. Referring to FIG. 4, a cross sectional view of another dual-sided chip package without a die pad corresponding to FIGS. 3A–3B is shown. The major difference in FIG. 4 compared to FIGS. 3A–3B is that the back of the die 304 is attached to the front of the die 302 by using the adhesive 309.

Embodiment 3

Figure 5A:
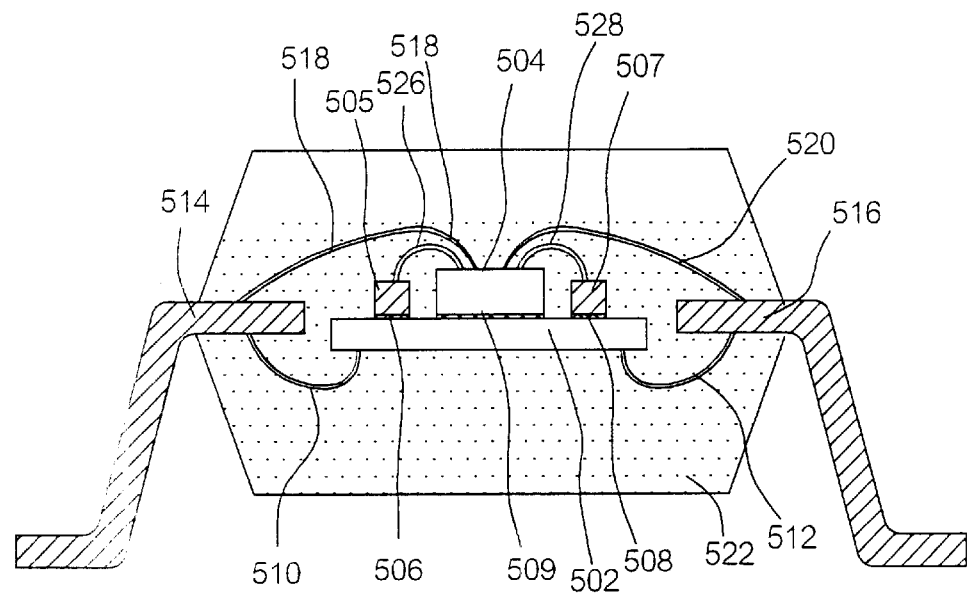
FIGS. 5A~5B show a cross sectional view and an upper view of a dual-sided chip package without a die pad by using a bus bar according to the third preferred embodiment of the invention.
Figure 5B:
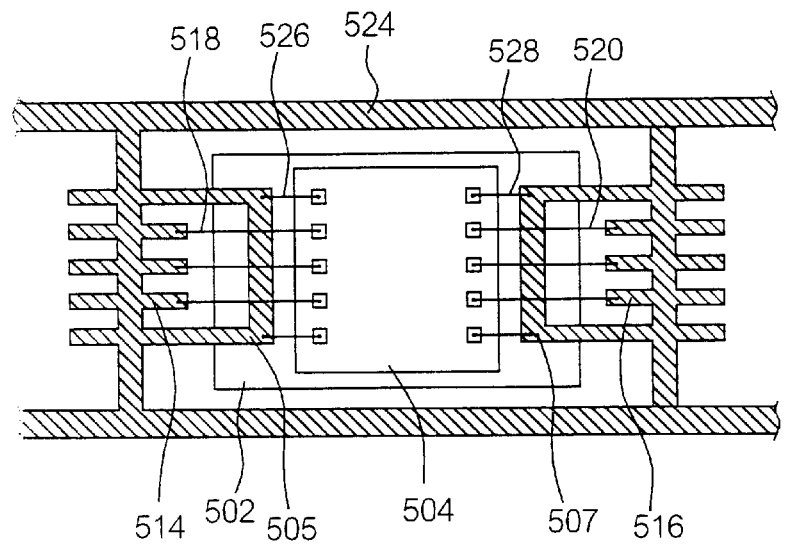

Refereeing to FIGS. 5A–5B, a cross sectional view and an upper view of a dual-sided chip package which lacks a die pad and which uses a support bar arrangement according to the third preferred embodiment of the invention are shown. The two dies are in back-to-back disposition and the support bar arrangement includes a ground bus bar and a power bus bar. Within the spirit disclosed in the first example according to the invention, the die can be either attached to the inner lead fingers directly or fixed on the support bar arrangement of the leadframe. As shown in FIGS. 5A–5B, the die 502 is attached to the bus bars 505 and 507 by using the adhesive 506 and 508 respectively. The bonding wires 510 and 512 couple the die 502 and the inner lead fingers 514 and 516. The die 504 is attached to the back of the die 502 by using the adhesive 509 so that the back of the die 502 connects to the back of the die 504. The bonding wires 518 and 520 couple the die 504 and the inner lead fingers 514 and 516. The inside of plastic mold 522 includes the dies 502 and 504, the bonding wires 510, 512, 518 and 520, the bus bars 505 and 507, and the inner lead fingers 514 and 516. The bus bars 505 and 507 are connected with the leadframe 524 and are rectangular. The bus bar 505 can be a ground bus bar while the bus bar 507 can be a power bus bar. The bus bars 505 and 507 are capable of supporting the dies 502 and 504. And the ground bonding wire 526 and the power bonding wire 528 are connected with the bus bars 505 and 507 respectively.

Figure 6:
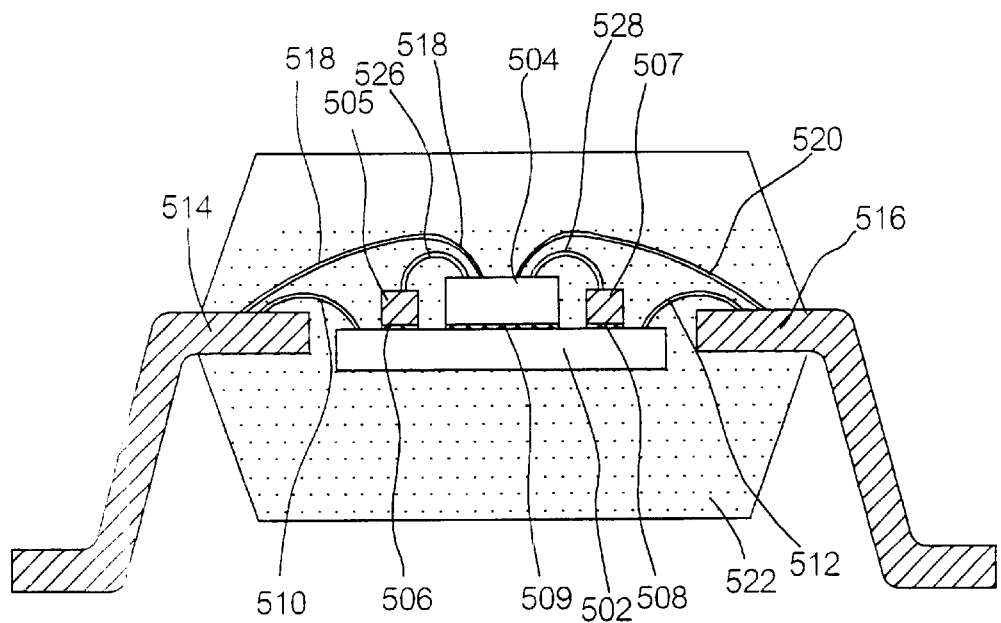
FIG. 6 shows a cross sectional view of another dual-sided chip package without a die pad corresponding to FIGS. 5A~5B.

Furthermore, within the spirit according to the invention disclosed in FIGS. 5A–5B, the two dies 504 and 506 can be either in back-to-back disposition or in back-to-face disposition. FIG. 6 is a cross sectional view of another dual-sided chip package without a die pad corresponding to FIGS. 5A–5B. The major difference in FIG. 6 compared to FIGS. 5A–5B is that the back of the die 504 is attached to the front of the die 502 by using the adhesive 509.

The dual-sided chip package without a die pad according to the preferred embodiments of the invention results in a longer distance between the die surface and the plastic surface. Thus, it enables a large decrease in the probability of generating voids with no need to grind the dies. Besides, it improves the vibration and floating of the die pad in the manufacturing process and thus prevents the exposure of the bonding wires and the shelling off or breaking of the dies.

While the invention has been described by way of example and in terms of the preferred embodiments, it is to be understood that the invention is not limited to the disclosed embodiments. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A dual-sided chip package without a die pad, comprising: a leadframe, comprising a first support bar, a second support bar, a first inner lead finger, and a second inner lead finger, the first support bar and the second support bar being disposed between the first inner lead finger and the second inner lead finger;

a first die disposed between the first inner lead finger and the second inner lead finger, the first die having a back side that is attached to the first support bar and the second support bar;

a first bonding wire and a second bonding wire, coupling the first die with the first inner lead finger and the second inner lead finger;

a second die disposed between the first support bar and the second support bar, the second die having a back side that is connected to the back side of the first die, so that the dies are connected in a back-to-back disposition;

a third bonding wire and a fourth bonding wire, coupling the second die with the first inner lead finger and the second inner lead finger; and a molded plastic body encasing the first die, second die, first bonding wire, second bonding wire, third bonding wire, fourth bonding wire, first support bar, second support bar, first inner lead finger, and second inner lead finger.

2. The dual-sided chip package according to claim 1, wherein the first die is attached to the first support bar and the second support bar by using an adhesive.

3. The dual-sided chip package according to claim 1, wherein the second die is attached to the first die by using an adhesive.

4. The dual-sided chip package according to claim 1, wherein the first support bar and the second support bar are rectangles.

5. The dual-sided chip package according to claim 1, wherein the first and second dies additionally have front sides, wherein the first and second bonding wires are connected to points on the front side of the first die, and wherein the third and fourth bonding wires are connected to points on the front side of the second die.

6. A dual-sided chip package without a die pad, comprising:

a leadframe, comprising a first bus bar, a second bus bar, a first inner lead finger, and a second inner lead finger, the first bus bar and the second bus bar being disposed between the first inner lead finger and the second inner lead finger, a first die disposed between the first inner lead finger and the second inner lead finger, the first die having a back side that is attached to the first bus bar and the second bus bar;

a first bonding wire and a second bonding wire, coupling the first die with the first inner lead finger and the second inner lead finger;

a second die disposed between the first bus bar and the second bus bar, the second die having a back side that is connected to the back side of the first die, so that the dies are connected in a back-to-back disposition;

a third bonding wire and a fourth bonding wire, coupling the second die with the first inner lead finger and the second inner lead finger; and a molded plastic body encasing the first die, second die, first bonding wire, second bonding wire, third bonding wire, fourth bonding wire, first bus bar, second bus bar, first inner lead finger, and second inner lead finger.

7. The dual-sided chip package according to claim 6, wherein the first die is attached to the first bus bar and the second bus bar by using an adhesive.

8. The dual-sided chip package according to claim 6, wherein the second die is attached to the first die by using an adhesive.

9. The dual-sided chip package according to claim 6, wherein the first bus bar is a ground bus bar and the second bus bar is a power bus bar.

10. The dual-sided chip package according to claim 6, wherein the first and second dies additionally have front sides, wherein the first and second bonding wires are connected to points on the front side of the first die, and wherein the third and fourth bonding wires are connected to points on the front side of the second die.

11. The dual-sided chip package according to claim 6, further comprising a fifth bonding wire and a sixth bonding wire, coupling the second die to the first and second bus bars.

12. The dual-sided chip package according to claim 11, wherein the first and second bus bars have portions which extend outwardly therefrom to serve as lead fingers.

* * * * *